(12) United States Patent
Chen et al.

(10) Patent No.: US 7,892,703 B2
(45) Date of Patent: Feb. 22, 2011

(54) CPL MASK AND A METHOD AND PROGRAM PRODUCT FOR GENERATING THE SAME

(75) Inventors: Jang Fung Chen, Cupertino, CA (US); Duan-Fu Stephen Hsu, Fremont, CA (US); Douglas Van Den Broeke, Sunnyvale, CA (US); Jung Chul Park, Pleasanton, CA (US); Thomas Laidig, Point Richmond, CA (US)

(73) Assignee: ASML Masktools B.V., AH Veldhoven (NL)

( * ) Notice: Subject to any disclaimer, the term of this patent is extended or adjusted under 35 U.S.C. 154(b) by 922 days.

(21) Appl. No.: 11/501,916

(22) Filed: Aug. 10, 2006

(65) Prior Publication Data
US 2007/0065733 A1 Mar. 22, 2007

Related U.S. Application Data

(60) Provisional application No. 60/707,557, filed on Aug. 12, 2005.

(51) Int. Cl.
*G03F 1/00* (2006.01)
*G03F 7/00* (2006.01)
(52) U.S. Cl. .............................. 430/5; 430/322; 430/323
(58) Field of Classification Search ...................... 430/5, 430/311, 394, 322, 323; 716/19, 21
See application file for complete search history.

(56) References Cited

U.S. PATENT DOCUMENTS

| | | | |
|---|---|---|---|
| 5,446,521 A | 8/1995 | Hainsey et al. | |
| 6,605,481 B1 | 8/2003 | Wu et al. | |
| 2003/0077519 A1* | 4/2003 | Hsu | 430/5 |
| 2004/0063002 A1* | 4/2004 | Wu et al. | 430/5 |
| 2004/0115539 A1 | 6/2004 | Broeke et al. | |
| 2005/0019673 A1 | 1/2005 | Taravade et al. | |
| 2005/0058912 A1* | 3/2005 | Lin et al. | 430/5 |
| 2006/0088770 A1* | 4/2006 | Tan et al. | 430/5 |
| 2006/0240333 A1* | 10/2006 | Hung et al. | 430/5 |

OTHER PUBLICATIONS

Search Report issued in corresponding EP 0625424.8 on Oct. 2, 2008.

* cited by examiner

*Primary Examiner*—Mark F Huff
*Assistant Examiner*—Rashid Alam
(74) *Attorney, Agent, or Firm*—Pillsbury Winthrop Shaw Pittman LLP

(57) ABSTRACT

A method of generating a mask for printing a pattern including a plurality of features. The method includes the steps of obtaining data representing the plurality of features; and forming at least one of the plurality of features by etching a substrate to form a mesa and depositing a chrome layer over the entire upper surface of the mesa, where said mesa has a predetermined height.

20 Claims, 6 Drawing Sheets

Isolated CPL mask with SB

Cut-line

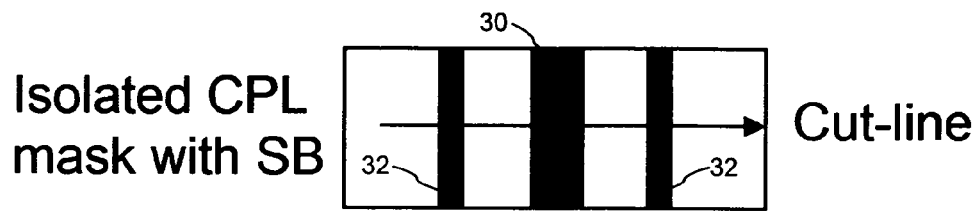
FIG. 3a
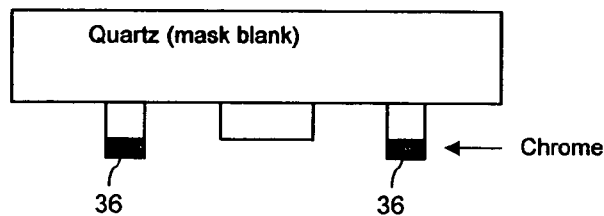
FIG. 3b
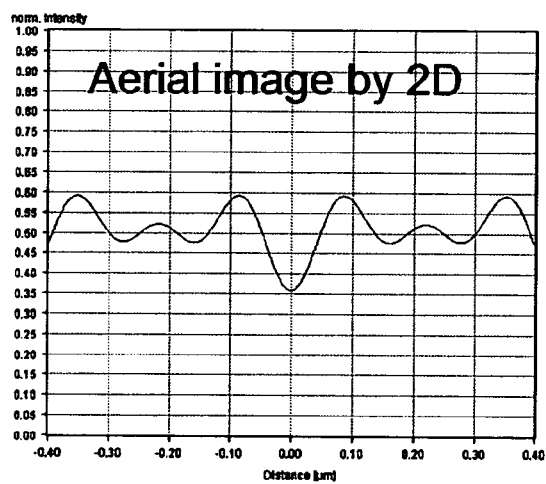 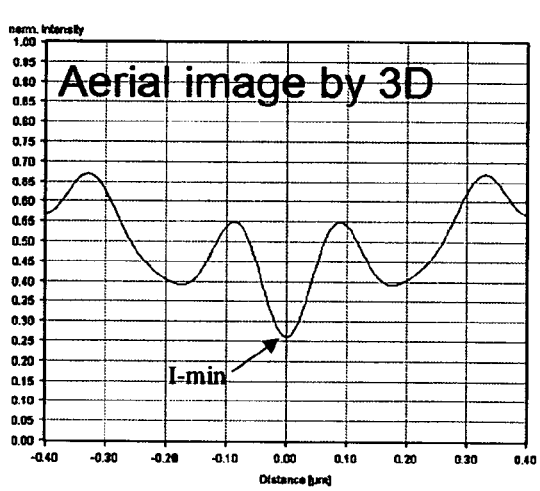
FIG. 3c            FIG. 3d

FIG. 4a
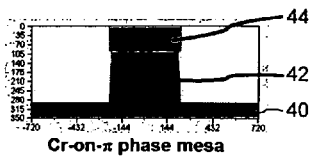
FIG. 4b
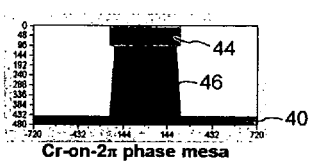
FIG. 4c
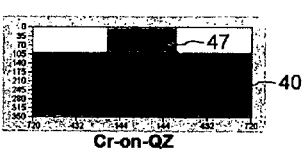
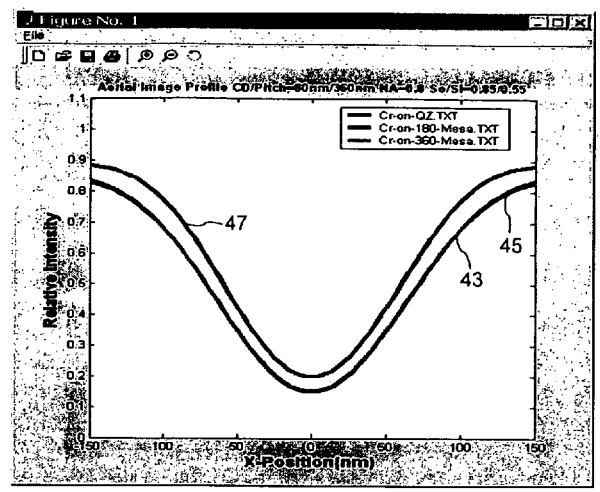
FIG. 4d
FIG. 5a
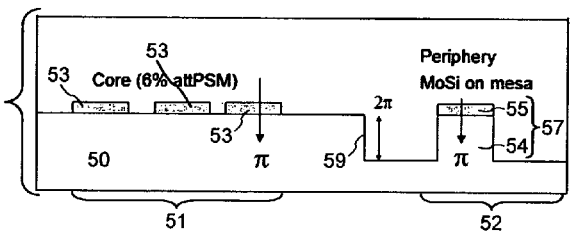
FIG. 5b
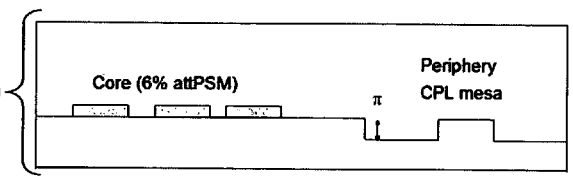
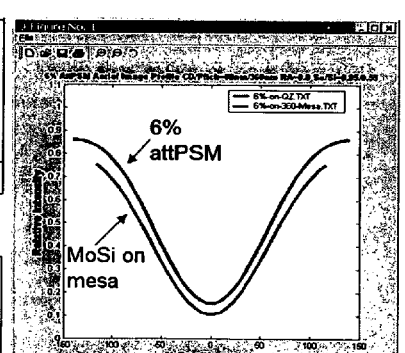
FIG. 5c

CPL MASK AND A METHOD AND PROGRAM PRODUCT FOR GENERATING THE SAME

RELATED APPLICATIONS

This application claims priority to U.S. Patent Application Ser. No. 60/707,557, filed on Aug. 12, 2005, which is incorporated herein by reference in its entirety.

TECHNICAL FIELD

The present invention relates generally to the generation of mask patterns for use with chromeless phase lithography (CPL) techniques, and more specifically, for methods and techniques for improving imaging of critical features while simultaneously reducing the complexity of the mask making process required to produce masks capable of imaging such critical features.

BACKGROUND OF THE INVENTION

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

Of course, one of the goals in integrated circuit fabrication is to faithfully reproduce the original circuit design on the wafer (via the mask). One technique, which is currently receiving attention from the photolithography community, for further improving the resolution/printing capabilities of photolithography equipment is referred to as chromeless phase lithography "CPL". As is known, when utilizing CPL techniques, the resulting mask pattern typically includes structures (corresponding to features to be printed on the wafer) which do not require the use of chrome (i.e., the features are printed by phase-shift techniques) as well as those that utilize chrome. Such CPL masks have been disclosed in USP Publication No. 2004-0115539 (the '539 reference), which is herein incorporated by reference in its entirety.

As discussed in the '539 reference, for actual manufacturing purposes it was found that it was beneficial to classify the mask design features into "three zones". Referring to FIG. 1a, Zone 1 features are those features with a critical dimension in the range that two phase edges (left and right) interact closely and form a single aerial image. As the two phase edges become further apart (or larger feature CD), each of the left and right phase edge form its own aerial image and the two do not interact, as shown in FIG. 1c. This type of feature is classified as a Zone 3. In this case, in order to prevent the Zone 3 features from being printed as two separate line patterns, a piece of dark chrome is placed on the top of the substrate, and the Zone 3 feature forms a single aerial image as shown in FIG. 1c. In other words, the Zone 3 features essentially become "chrome" mask features.

In the case where the CD dimension is such that the two phase-edges partially interact as shown in FIG. 1b, these features are classified as Zone 2 features. However, the aerial images formed by the partial phase edge interaction are quite poor in quality, and therefore unusable. The '539 reference discloses that by tuning the percent transmission using chrome patches, it is possible to obtain high fidelity aerial image for such features. Accordingly, by classifying the randomly designed mask features into the three imaging zones, and then applying optical proximity correction (OPC) accordingly, it is possible to achieve volume IC manufacturing with a CPL mask.

FIGS. 2a and 2b illustrate the application of the chrome patches (referred to as the "zebra" technique) and the application of a standard alternating phase-shift mask (Alt-PSM), respectively, for Zone 2 features, as well as a comparison between the performance of the CPL zebra technique and the Alt-PSM technique. Referring to FIG. 2a, for Zone 2 features (which in the given example are three parallel lines), the quartz substrate 20 is etched so as to form three sets of adjacent π-phase edges and then chrome patches 22 are disposed on top of the features 24 formed by the etching so as to form strips/patches of chrome (i.e., zebra pattern) on the upper surface of the etched feature 24. The duty ratio of the "zebra" pattern needs to be un-resolvable by the imaging tool so that the "zebra" essentially become digitally halftoned. In other words, the Zone 2 features are "shaded" phase patterns from the image tool point of view. The amount of shade (i.e., percentage transmission) is determined by the ratio between the size of the chrome patches (dark) vs. the size of the open areas (clear). By utilizing these patches, it is possible to control the percentage transmission for the Zone 2 mask features, and achieve high fidelity patterning.

Indeed, as shown in FIG. 2a, the "zebra' features comfortably rival the imaging performance associated with a standard alternating PSM (AltPSM) mask 26, which is illustrated in FIG. 2b, and is imaging the same three parallel line pattern as imaged by the mask in FIG. 2a. As shown, both of the resulting aerial images show excellent minimum aerial image (I-min), and better image contrast since lower I-min means it is a "darker" image that can better form a higher fidelity line pattern. However, for the Zone 2 features imaged utilizing the zebra CPL technique, the resulting aerial image is inherently much more symmetrical near the outer sides of the group line patterns. This is one of the major benefits of using the zebra CPL techniques because a more practicable OPC treatment is feasible. One issue with utilizing the zebra technique for implementing Zone 2 features in a mask is that such zebra mask features require the use of an e-beam or high-resolution mask making process. Borderline quality zebra mask patterns reduce effectiveness of transmission control during patterning. The zebra pattern can also cause difficulty in reticle inspection that is necessary to ensure defect free masks. However, it is noted that for the leading edge lithography manufacturing, zebra features are the best option if a quality CPL zebra mask is deliverable.

In view of the foregoing, it is therefore desirable to have a CPL mask that can minimize the use of zebra patterns for imaging Zone 2 features, but which can still achieve the satisfactorily printing performance. Moreover, due to the variety of IC design styles, such as memory core vs. periphery pattern area, it is desirable to have a more flexible and improved CPL mask design that satisfies the printing performance required without necessarily resorting to the use of the zebra mask design for imaging, for example, Zone 2 features.

Thus, it is an object of the present invention to provide an alternative to the zebra patterning technique previously disclosed in the '539 reference, so as to provide a CPL mask which eliminates the foregoing issues associated with utilizing the zebra patterning technique.

SUMMARY OF THE INVENTION

As noted above, it is one object of the present invention to provide a method and technique for generating mask patterns capable of imaging features having critical dimensions corresponding to, for example, Zone 1 or Zone 2 features, that eliminates the need for the use of the zebra patterning technique.

More specifically, in one exemplary embodiment, the present invention relates to a method of generating a mask for printing a pattern including a plurality of features. The method includes the steps of obtaining data representing the plurality of features; and forming at least one of the plurality of features by etching a substrate to form a mesa and depositing a chrome layer over the entire upper surface of the mesa, where said mesa has a predetermined height.

In a second exemplary embodiment, the present invention relates to method of a generating a mask for printing a pattern comprising a plurality of features, which includes the steps of obtaining data representing the plurality of features; and forming at least one of the plurality of features by etching a substrate to form a mesa and depositing a light transmissive, phase shifting material over the entire upper surface of the mesa, where the mesa has a predetermined height.

The present invention provides important advantages over the prior art. Most importantly, the present invention eliminates the need to implement the zebra patterning technique, and significantly reduces the complexity of mask making process. In addition, the present invention provides a simple process for tuning features located, for example, in a peripheral area of the circuit design to features located in a core, dense area of the circuit design, so as to allow the peripheral located features and the core features to be imaged utilizing a single illumination. Another advantage of the present invention is that it minimizes the issues associated with phase edge printing in transition regions within the circuit design. Yet another advantage of the present invention is that by using "leaky chrome" as detailed below, it is possible to utilize both 6% attCPL and pure phase CPL features on the mask, which allows for 6% π-phase shifted light to be utilized in conjunction with features, including Zone 2 and Zone 3 features, thereby providing for improved imaging performance.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

The invention itself, together with further objects and advantages, can be better understood by reference to the following detailed description and the accompanying drawings.

BRIEF DESCRIPTION OF THE DRAWINGS

FIG. 3a illustrates an exemplary CPL line feature with scattering bars adjacent each edge.

FIG. 3b illustrates a 3D mask topology in which the SB features of FIG. 3a have a layer of chrome deposited on the entire upper surface thereof.

FIGS. 3c and 3d illustrate the resulting aerial image for the 2D topology and the 3D topology, respectively.

FIG. 4a illustrates a cross-section of a CPL mask feature in accordance with the present invention implemented utilizing a chrome layer deposited over a π-phase mesa etched in a substrate.

FIG. 4b illustrates a cross-section of a CPL mask feature in accordance with the present invention implemented utilizing a chrome layer deposited over a 2π-phase mesa etched in a substrate.

FIG. 4c illustrates a cross-section of a prior art binary mask feature in accordance with the present invention implemented utilizing a chrome layer deposited over a substrate.

FIG. 4d illustrates the aerial image performance associated with the CPL and binary features illustrated in FIGS. 4a-4c.

FIG. 5a illustrates a CPL mask feature formed in accordance with a second embodiment and disposed in a peripheral area of a circuit having a core portion in which the features are implemented utilizing 6% AttPSM.

FIG. 5b illustrates a prior art implementation of mask having 6% AttPSM and binary features.

FIG. 5c illustrates the aerial image performance of the CPL mask feature of FIG. 5a relative to the features in the core portion of the circuit, which are implemented utilizing 6% AttPSM.

DETAILED DESCRIPTION OF THE INVENTION

As explained in more detail below, the mask and method for generating a mask in accordance with the present invention implements features utilizing a phase mesa having chrome or MoSi deposited along the entire upper surface of the features, thereby eliminating the need for formation of the zebra pattern required by the prior art zebra technique. This mask formation technique is particularly applicable to those features having a CD dimension corresponding to a Zone 2 feature (i.e., those features for which when the feature is implemented in the mask utilizing adjacent phase edges, the two phase-edges partially interact, but the interaction is insufficient to satisfactory image the feature). However, the technique can also be utilized to implement features falling outside of the Zone 2 category, such as Zone 1 and Zone 3 type features.

Figures 1A, 1B, 1C:
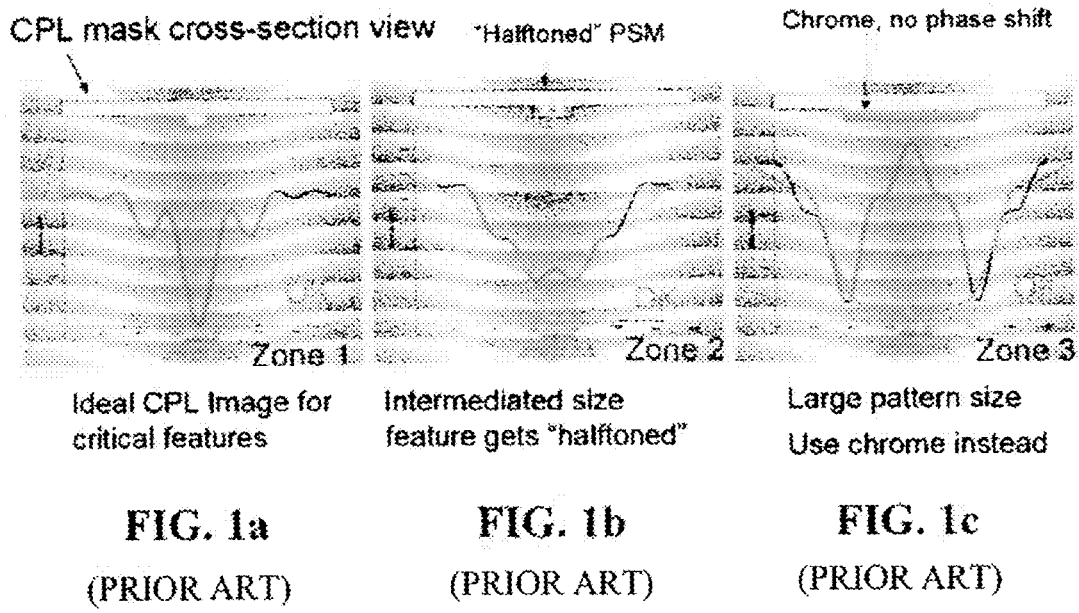
FIGS. 1a-1c illustrate known techniques for implementing features having different CD dimensions utilizing a CPL mask, and the corresponding imaging performance of each technique.
Figures 2A, 2B:
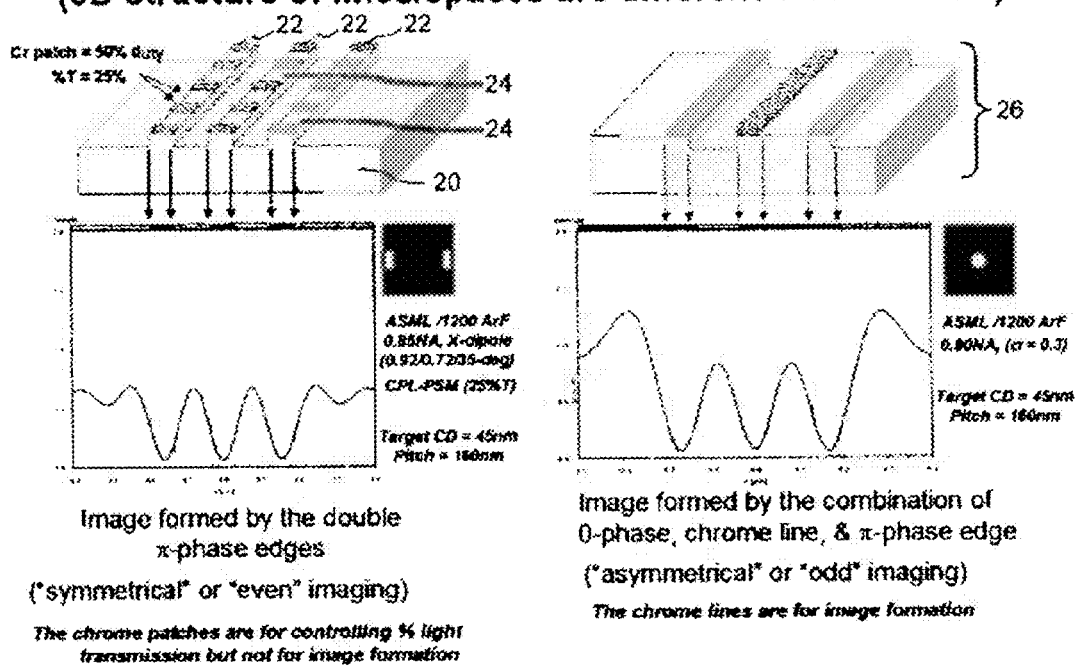
FIG. 2a illustrates a known CPL mask for imaging three parallel lines, which utilizes the CPL zebra technique for imaging features, and the corresponding imaging performance of the mask.
FIG. 2b illustrates a standard Alt-PSM mask design to image the same three line features as the mask shown in FIG. 2a, and the corresponding imaging performance of the mask.

As shown in FIG. 2a, the CPL mask feature is 3D in nature. In other words, the CPL mask topography includes etched phase features 24 with and without a layer thickness of chrome 22 deposited on the top of the features 24. It has been found that the use of 3D mask features enhance the resulting image. This is shown in FIGS. 3a-3d. FIG. 3a illustrates a CPL line feature 30 to be imaged, having OPC scattering bars 32 disposed on each side of the CPL line feature 30. The cutline in FIG. 3a samples the aerial image for both SB features 32 and the CPL feature line 30. FIG. 3b illustrates a 3D mask topology in which the SB features 32 have a layer of chrome 36 deposited on the entire upper surface thereof. A 2D mask topology for the mask shown in FIG. 3a would be the same as that shown in FIG. 3b, with the difference being that there would be no chrome deposited on the top of the SB features 32. FIGS. 3c and 3d illustrate the resulting aerial image for the 2D topology and the 3D topology, respectively. As is shown by a comparison of FIGS. 3c and 3d, the resulting aerial image is more enhanced by the 3D mask topography as compared to the aerial image based on the 2D topology. For the CPL feature line 30 (phase only) of the given example, the actual I-min is approaching 0.25 for the 3D mask topology vs. 0.35 for the 2D mask topology. With respect to the SB features 32, the SB features 32 appear much more pronounced and "darker" for the 3D mask topology vs. the 2D mask topology.

From FIGS. 3c and 3d, it is clear that the aerial image for the SB features 32 as influenced by 3D mask topography have more contrast than the SB features as influenced by the 2D mask topology. As such, the 3D mask topology effect makes it harder for the SB features 32 to maintain "sub-resolution". It is this 3D mask topology effect that the present invention utilizes to enhance the printing performance of CPL mask features, without resorting to the need for utilizing the zebra patterning technique.

In accordance with the present invention, in a first embodiment, the CPL feature to be imaged is formed in the mask utilizing a chrome-on-mesa phase feature. More specifically, a chrome layer is deposited over the entire upper surface of a mesa phase feature etched in the substrate. As explained in further detail below, the chrome layer does not provide for light transmission and therefore does not introduce any phase-shift into the light. As best understood by the Applicants, the enhanced imaging effect results from a waveguide-effect in which the illuminated light first picks up imaging information as the light passes the sidewalls of the phase mesa and is pulled into the quartz, and then additional imaging information is picked up as this light, which was pulled into the sidewalls of the phase mesa formed in the quartz, is then blocked by the chrome deposited on top of the phase mesa (in the imaging process, the illumination light will first contact the quartz substrate, then the phase mesa etched in the substrate etch substrate and then the chrome layer deposited on top of the phase mesa). As noted, in the given embodiment, the chrome layer deposited on top of the phase mesa does not provide for transmission of light, and therefore does not introduce any phase-shift with regard to the transmitted light. The image enhancement obtained is a result of the use of the chrome-on-phase mesa structure.

FIGS. 4a and 4b illustrate two variations of the first embodiment of the present invention. More specifically, FIG. 4a illustrates a cross-section of a CPL mask feature which includes a quartz substrate 40 having a π-phase mesa 42 etched therein, and a chrome layer 44 deposited on top of the π-phase mesa 42. It is noted that the chrome layer 44 is formed over the entire top surface of the phase mesa 42 (thereby eliminating the issues for fabricating the zebra pattern of the prior art). FIG. 4b illustrates a cross-section of a CPL mask feature which includes a quartz substrate 40 having a 2π-phase mesa 46 etched therein, and a chrome layer 44 deposited on top of the 2π-phase mesa 46. Once again, it is noted that the chrome layer is formed over the entire top surface of the phase mesa 46. FIG. 4c illustrates a prior art mask feature in which a chrome layer 47 is deposited directly on the surface of the quartz substrate 40.

FIG. 4d illustrates the aerial performance associated with the CPL features illustrated in FIGS. 4a-4c. It is noted that the exemplary features illustrated in FIGS. 4a-4c correspond to a 80 nm line feature with 360 nm pitch imaged under the exposure conditions of 0.8 NA and a quasar illumination of 0.85/0.55 setting. As shown in FIG. 4d, the aerial image 43 resulting from the chrome on π-phase mesa structure of FIG. 4a, and the aerial image 45 resulting from the chrome on 2π-phase mesa structure of FIG. 4b are essentially identical, and have lower (i.e., "darker") I-min values than the aerial image 47 resulting from the non phase-shifted, chrome on quartz feature, of FIG. 4c. As is known, lower I-min values result in better imaging performance for printing lines. FIG. 4d also shows that the aerial image width is wider for the chrome on phase mesa structures. However, this can be compensated for by applying appropriate OPC techniques.

As noted, there is no noticeable aerial image performance difference between the chrome on π-phase mesa structure of FIG. 4a, and the chrome on 2π-phase mesa structure of FIG. 4b. However, one advantage for using the 2π-phase mesa is that it allows more tolerance since the etched range is twice as great. It is further noted that with regard to the chrome-on-mesa structure, as the chrome does not transmit light and there is no phase-shift associated with the light, it is possible to etch the substrate to heights other than corresponding to π or 2π phase shifts. The structure of the first embodiment of the present invention is particularly useful for implementing Zone 2 features, as defined above, in a mask design. Thus, when performing CPL full-chip treatment, and classifying the features to be imaged into either Zone 1, Zone 2 or Zone 3 categories, the foregoing chrome-on-mesa phase features discussed above can be utilized to implement the Zone 2 features in the mask design, thereby eliminating the need to perform the zebra technique for Zone 2 features. As noted, the chrome is deposited over the entire upper surface of each of the Zone 2 features.

In a second embodiment of the present invention, as opposed to a chrome layer being deposited over the entire surface of the phase mesa etched in the substrate, a material having a certain percentage transmission is deposited over the entire upper surface of the phase mesa. For example, a layer of MoSi, which exhibits a 6% transmission of light, can be deposited over the phase mesa in order to implement the CPL feature in the mask design. It is noted that the present invention is not limited to the use of MoSi, or materials having 6% transmission, other materials and different % transmission of light may also be utilized. As with the first embodiment of the present invention, the combination of the MoSi layer and the phase mesa function to enhance the resulting imaging performance due to the waveguide effects noted above. Further, the light transmissive layer may also introduce a phase shift with respect to the transmitted light. As with the first embodiment, the second embodiment of the present invention may also be utilized to implement Zone 2 features in a mask design. In addition to the use of MoSi, other possible materials include, but are not limited to TaSi, CrON and Al). With respect to the transmission of light, the useful range is typically approximately 5-30%.

In addition, the structure of the second embodiment of the present invention having a light transmissive layer deposited over the entire phase mesa structure can be utilized to assist matching the exposure energy required for exposing a core portion of a circuit design with features (e.g., Zone 1 or Zone 2 type feature) disposed on a periphery of the circuit design. For example, considering a memory device, the core area of the memory device can be optimized with existing mask processes, such as 6% attPSM. This is due to the fact that 6% attPSM performs well for very dense areas under aggressive k1 (i.e., <0.31). Thus, for a very dense memory core is a preferable to utilize 6% attPSM to implement the dense core features in the mask. However, for a less dense periphery (not memory core) pattern area, the imaging performance for 6% attPSM is poor. As such, CPL techniques are a preferred option.

However, when attempting to match 6% attPSM in the core to a 100% transmission CPL feature, such as a Zone 1 feature, located in the periphery area, there is likely to be a mis-match in the exposure energy required to illuminate each area. Indeed, the optimum exposure energy is much different for 6% attPSM as compared to the one for optimal printing of a Zone 1 CPL feature. Thus, in order to ensure that both the core and the periphery print within the specified error tolerances for the given mask, it is necessary to tune the % transmission of the CPL mask feature for imaging the feature in the periphery area. One method for tuning the % transmission of the features in the periphery area is to use prior art zebra technique to implement the CPL mask features, where the size of the chrome patch and open areas can be adjusted accordingly to accomplish transmission tuning. However, this can be undesirable due to the complexity and potential difficulties associated with implementing the zebra patterning technique.

An alternative to the zebra technique is to utilize the transmissive layer on phase mesa structure of the second embodiment of the present invention. FIG. 5a illustrates how the transmissive layer on phase mesa structure can be utilized to perform the foregoing tuning, as well as illustrating the basic structure of the transmissive layer of phase mesa structure in accordance with the second embodiment. Referring to FIG. 5a, the figure illustrates a core area 51 of a mask design and a peripheral area 52 of the mask design. In the given example, the core area 51 includes dense features which are implemented utilizing 6% attPSM material 53 disposed on the substrate 50. The peripheral area 52 includes a Zone 1 feature, which is implemented using the structure of the second embodiment. Specifically, the Zone 1 feature 57 is implemented by forming/etching a 2π-phase mesa 54 in the substrate 50 and then depositing a layer 55 of MoSi over the entire upper surface of the 2π-phase mesa 54. It is noted that because the MoSi already has a π-shift, it is necessary to use 2π-etched depth for the phase mesa 54. This is necessary to preserve the same phase-shift through both the 6% attPSM features 53 and the MoSi layer 55 on phase mesa feature 57 formed in the peripheral area. However, it is also noted that because of the 2π etch depth of the phase mesa feature 54, the single phase edge 59 formed in the transition area between the core and peripheral area does not print because it is not phase shifted. Thus, the MoSi layer 55 on phase mesa structure 54 allows for both transmission tuning between the core and peripheral areas so that a single illumination can be utilized to image both areas, and for the prevention of imaging of single phase edges in the transition areas.

FIG. 5b illustrates an example of utilizing the prior art Zone 1 CPL technique, in which two adjacent phase edges are utilized to image the peripheral feature. As shown, the phase edges are formed by etching the substrate to a depth of $\pi$. As discussed above, this results in the transition area having an etch depth of $\pi$, which may result in the unwanted imaging of the phase-edge in the substrate.

Thus, using 6% attPSM in core and with CPL or zebra CPL in periphery, can cause single-phase edge printing in the transition area. However, the MoSi-on-phase-mesa structure of the second embodiment has a $2\pi$ etch depth, and therefore it is not phase-shifted. As a result, it is possible to minimize single-phase edge printing issue ($2\pi$ edge is not printable) in the transition from core to the periphery area. The aerial image simulation illustrated in FIG. 5c confirms that the MoSi-on-phase mesa structure of the second embodiment has comparable imaging performance to the 6% attPSM features.

Figure 6A:
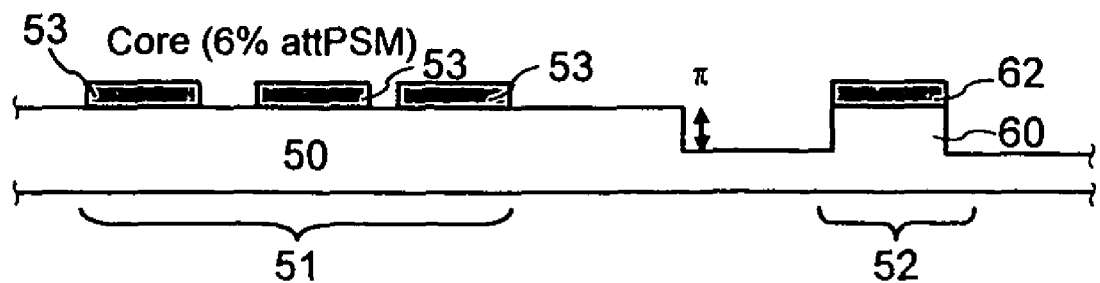
FIG. 6a illustrates a variation of the second embodiment, in which the CPL feature is implemented utilizing a "leaky" chrome structure.

In a variation of the second embodiment, it is possible to utilize "leaky" chrome disposed on the entire upper surface of a CPL feature as shown, for example, in FIG. 6a. Similar to FIG. 5a, FIG. 6a illustrates a core portion of the circuit implemented in the mask using 6% attPSM features, and a peripheral portion in which a CPL feature utilizing the "leaky" chrome structure of the given embodiment is implemented. "Leaky" chrome as referred to herein, is chrome which is designed to allow a specific % amount of transmission of light, but has zero phase shift. This can be accomplished by, for example, but not limited to, controlling the composition of the chrome or the thickness of the chrome layer deposited on top of the CPL feature. Referring to FIG. 6a, the CPL feature 60, which may be for example a Zone 1 or Zone 2 type feature has a layer of "leaky" chrome 62 deposited on the entire upper surface of the feature. By etching the background area adjacent the CPL feature having the leaky chrome deposited thereon to a $\pi$ etch depth, it is possible to utilize this structure to create "effective PSM", because the light passing through the background area is $\pi$-phase shifted relative to the light passing through the leaky chrome. Thus, the CPL feature with leaky chrome disposed thereon provides for effective PSM with controllable transmission and therefore can also be utilized to tune the features in a peripheral area of a mask design such that the features in a core area and the features in the peripheral area can be imaged within acceptable error criteria with a single illumination.

As another example, the chrome is deposited over substantially the entire upper surface of the CPL feature and has a thickness sufficiently thin such that the chrome exhibits substantially 6% transmission. The 6% transmission chrome in combination with the etched substrate, which is etch to a $\pi$-phase depth, form the Zone 2 feature in the mask. By utilizing the foregoing technique, the mask making process is significantly reduced as there is no longer a need for a plurality of chrome strips to be utilized in conjunction with each Zone 2 feature. It is also possible to utilize the leaky chrome on Zone 3 features.

Figure 6B:
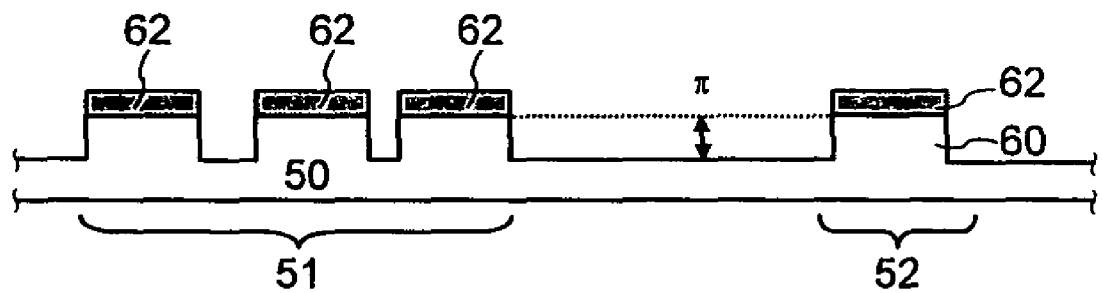
FIG. 6b illustrates another variation of the second embodiment, in which the features in the core area are also formed utilizing "leaky" chrome.

In another variation as shown in FIG. 6b, in addition to the CPL feature 60 being formed with leaky chrome, the leaky chrome may also be utilized to form the core area features. Referring to FIG. 6b, leaky chrome 62 is deposited over the substrate 50 in replacement of the attenuated PSM material 53 shown in FIG. 6a so as to form the dense features in the core area of the mask pattern. It is noted, however, that it would also be necessary to etch the background portion of the substrate to a $\pi$-phase etch depth in the core area if leaky chrome is to be utilized to image the core area features.

As noted above, the present invention provides important advantages over the prior art. Most importantly, the present invention eliminates the need to implement the zebra patterning technique, and significantly reduces the complexity of mask making process. In addition, the present invention provides a simple process for tuning features located, for example, in a peripheral area of the circuit design to features located in a core, dense area of the circuit design, so as to allow the peripheral located features and the core features to be imaged utilizing a single illumination. Yet another advantage of the present invention is that it minimizes the issues associated with phase edge printing in transition regions within the circuit design.

Figure 7:
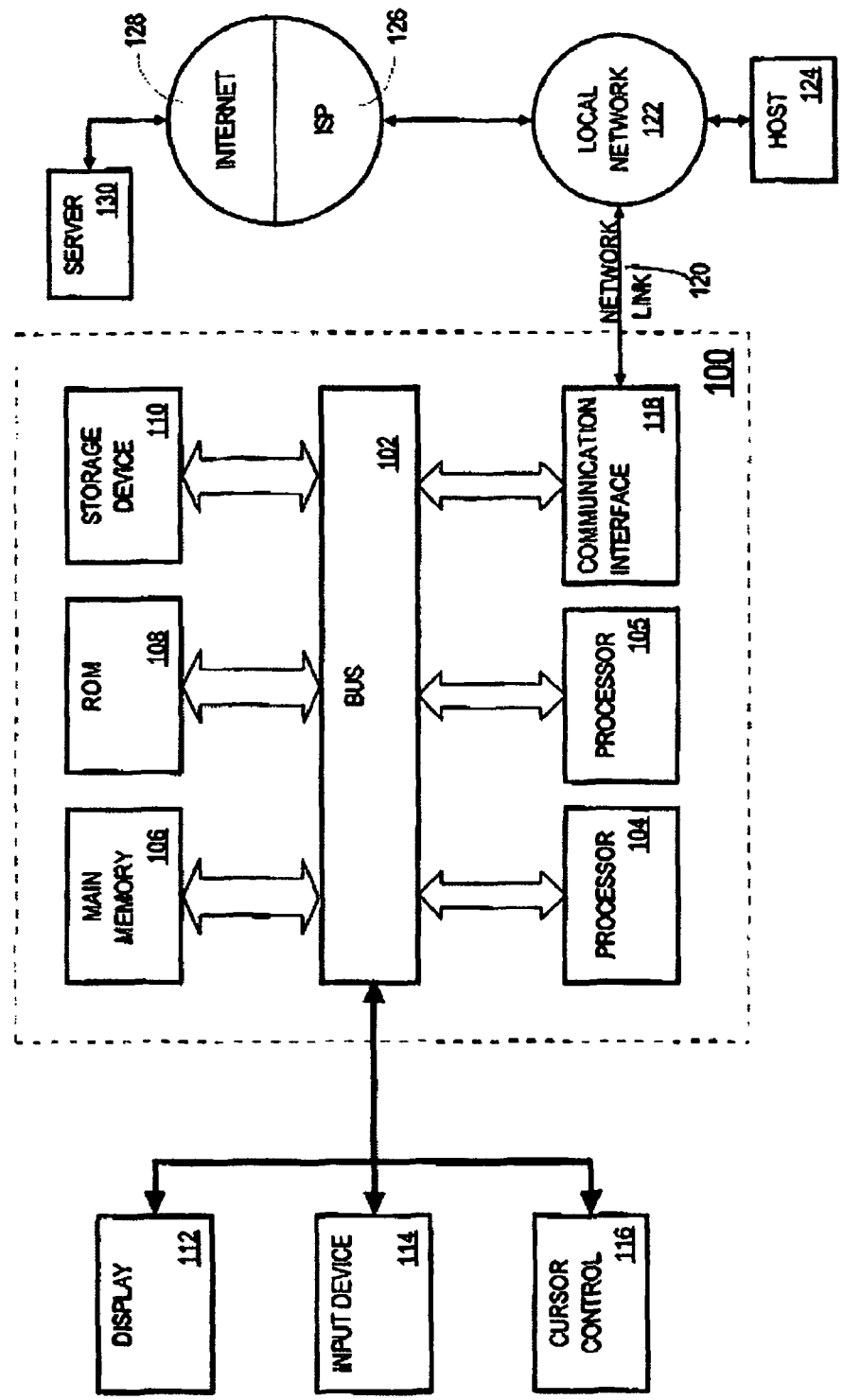
FIG. 7 is a block diagram that illustrates a computer system which can implement illumination optimization according to an embodiment of the present invention.

FIG. 7 is a block diagram that illustrates a computer system 100 which can implement the illumination optimization explained above. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, the coloring process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 8:
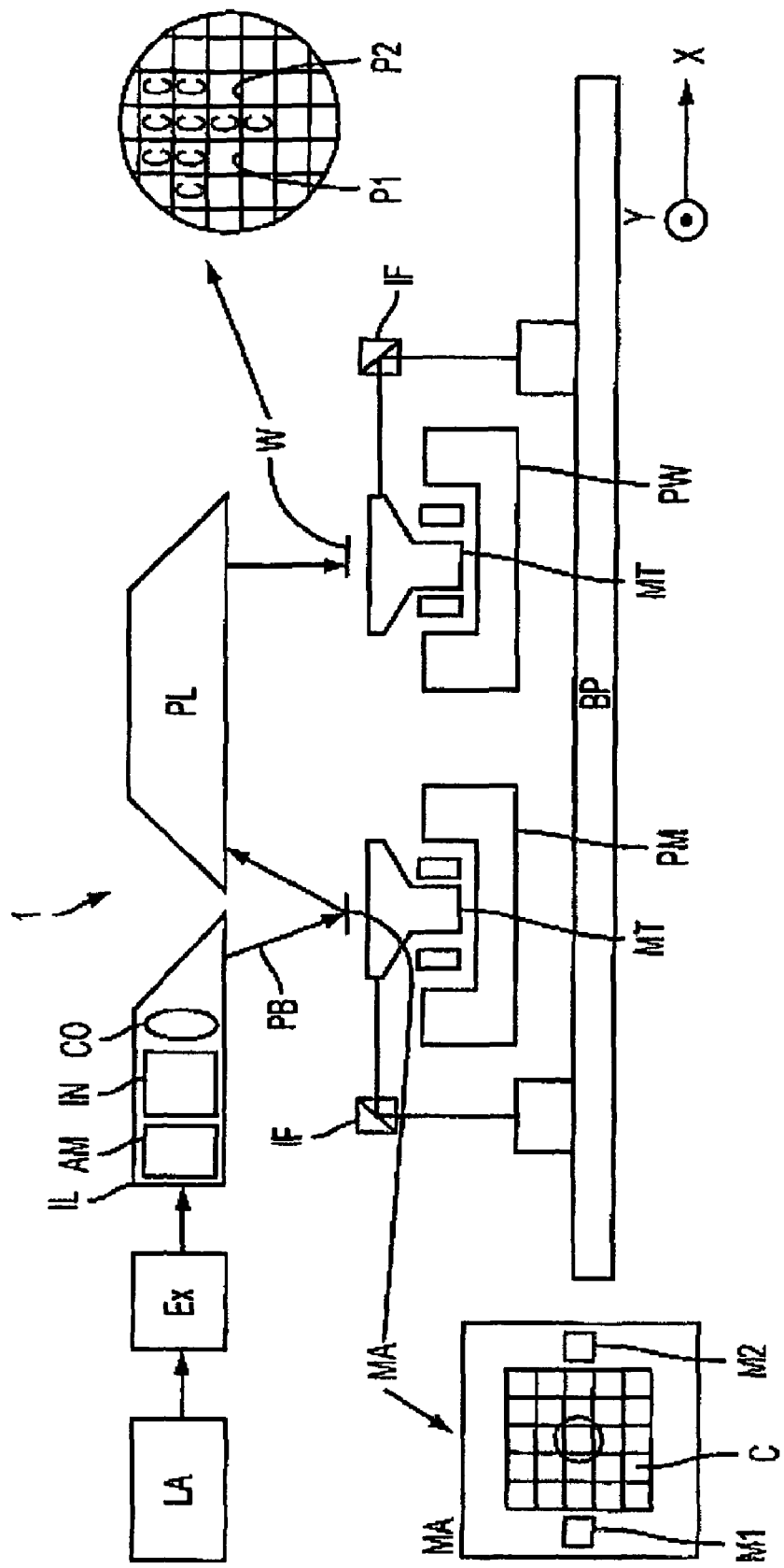
FIG. 8 schematically depicts an exemplary lithographic projection apparatus suitable for use with a mask designed with the aid of the disclosed concepts.

FIG. 8 schematically depicts a lithographic projection apparatus suitable for use with a mask designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 8 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 8. However, in the case of a wafer stepper (as opposed to a step-and-scan tool) the mask table MT may just be connected to a short-stroke actuator, or may be fixed.

The depicted tool can be used in two different modes:
In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Additionally, software may implement or aid in performing the disclosed concepts. Software functionalities of a computer system involve programming, including executable code, may be used to implement the above described imaging model. The software code is executable by the general-purpose computer. In operation, the code, and possibly the associated data records, are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platforms discussed above. Volatile media include dynamic memory, such as main memory of such a computer platform. Physical transmission media include coaxial cables, copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of a generating a mask for printing a pattern comprising a plurality of features, said method comprising the steps of:
   obtaining data representing said plurality of features; and
   forming structures in the mask corresponding to said plurality of features, including etching a transparent substrate to form a mesa for printing one of said features and depositing a chrome layer over the entire upper surface of said mesa, wherein said mesa has a predetermined height corresponding to a desired phase shift of light passing through said mask adjacent to sidewalls of said mesa.

2. The method of claim 1, wherein said chrome layer has zero percentage light transmission.

3. The method of claim 1, wherein said chrome layer allows for a predetermined percentage of light transmission.

4. The method of claim 1, wherein said predetermined height of said mesa corresponds to Π phase shift or 2Π phase shift with respect to light traversing the mesa.

5. A non-transitory recording medium readable by a computer, means recorded on the recording medium for directing the computer to perform a process to generate a file representing a mask for imaging a target pattern having a plurality of features, the process comprising the steps of:
   obtaining data representing said plurality of features; and
   defining structures in the mask corresponding to said plurality of features to be imaged, wherein one of the structures for imaging one of the features is formed in the mask by etching a transparent substrate to form a mesa and depositing a chrome layer over the entire upper surface of said mesa, wherein said mesa has a predetermined height corresponding to a desired phase shift of light passing through said mask adjacent to sidewalls of said mesa.

6. The non-transitory recording medium of claim 5, wherein said chrome layer has zero percentage light transmission.

7. The non-transitory recording medium of claim 5, wherein said chrome layer allows for a predetermined percentage of light transmission.

8. The non-transitory recording medium of claim 5, wherein said predetermined height of said mesa corresponds to Π phase shift or 2Π phase shift with respect to light traversing the mesa.

9. A method of a generating a mask for printing a pattern comprising a plurality of features, said method comprising the steps of:
   obtaining data representing said plurality of features; and
   forming structures in the mask corresponding to said plurality of features, including etching a transparent substrate to form a mesa for printing one of said features and depositing a light transmissive, phase shifting material over the entire upper surface of said mesa, wherein said mesa has a predetermined height corresponding to a desired phase shift of light passing through said mask adjacent to sidewalls of said mesa.

10. The method of claim 9, wherein said light transmissive, phase shift material has a predetermined percentage transmission and a predetermined phase shift.

11. The method of claim 9, wherein said predetermined height of said mesa corresponds to Π phase shift or 2Π phase shift with respect to light traversing the mesa.

12. A non-transitory recording medium readable by a computer, means recorded on the recording medium for directing the computer to perform a process to generate a file representing a mask for imaging a target pattern having a plurality of features, the process comprising the steps of:

obtaining data representing said plurality of features; and defining structures in the mask corresponding to said plurality of features to be imaged, wherein one of the structures for imaging one of the features is formed in the mask etching a transparent substrate to form a mesa and depositing a light transmissive, phase shift material over the entire upper surface of said mesa, wherein said mesa has a predetermined height corresponding to a desired phase shift of light passing through said mask adjacent to sidewalls of said mesa.

13. The non-transitory recording medium of claim 12, wherein said light transmissive, phase shift material has a predetermined percentage transmission and predetermined phase shift.

14. The non-transitory recording medium of claim 12, wherein said predetermined height of said mesa corresponds to Π phase shift or 2Π phase shift with respect to light traversing the mesa.

15. A device manufacturing method comprising the steps of:
(a) providing a substrate that is at least partially covered by a layer of radiation sensitive material;
(b) providing a projection beam of radiation using an imaging system;
(c) generating a mask utilized to endow the projection beam with a pattern in its cross-section;
(d) projecting the patterned beam of radiation onto a target portion of the layer of radiation-sensitive material,
wherein, in step (c), said mask is formed by a method comprising the steps of:
obtaining data representing a plurality of features; and
forming structures in the mask corresponding to said plurality of features, including etching a second transparent substrate to form a mesa for printing one of said features and depositing a chrome layer over the entire upper surface of said mesa, wherein said mesa has a predetermined height corresponding to a desired phase shift of light passing through said mask adjacent to sidewalls of said mesa.

16. A device manufacturing method comprising the steps of:
(a) providing a substrate that is at least partially covered by a layer of radiation-sensitive material;
(b) providing a projection beam of radiation using an imaging system;
(c) generating a mask utilized to endow the projection beam with a pattern in its cross-section;
(d) projecting the patterned beam of radiation onto a target portion of the layer of radiation-sensitive material,
wherein, in step (c), said mask is formed by a method comprising the steps of:
obtaining data representing said plurality of features; and
defining structures in the mask corresponding to said plurality of features to be imaged, wherein one of the structures for imaging one of the features is formed in the mask by etching a second transparent substrate to form a mesa and depositing a light transmissive, phase shift material over the entire upper surface of said mesa, wherein said mesa has a predetermined height corresponding to a desired phase shift of light passing through said mask adjacent to sidewalls of said mesa.

17. A method according to claim 1, wherein certain of said plurality of features are located in dense areas of the mask, and certain other of the plurality of features are located in peripheral areas of the mask, the certain features and certain other features also being formed as mesas with chrome deposited entirely thereon.

18. A method according to claim 5, wherein certain of said plurality of features are located in dense areas of the mask, and certain other of the plurality of features are located in peripheral areas of the mask, the certain features and certain other features also being formed as mesas with chrome deposited entirely thereon.

19. A method according to claim 9, wherein certain of said plurality of features are located in dense areas of the mask, and certain other of the plurality of features are located in peripheral areas of the mask, the certain features and certain other features also being formed as mesas with the phase shift material deposited entirely thereon.

20. A method according to claim 12, wherein certain of said plurality of features are located in dense areas of the mask, and certain other of the plurality of features are located in peripheral areas of the mask, the certain features and certain other features also being formed as mesas with the phase shift material deposited entirely thereon.

* * * * *